US006792386B2

(12) United States Patent
Dobson

(10) Patent No.: US 6,792,386 B2
(45) Date of Patent: Sep. 14, 2004

(54) METHOD AND SYSTEM FOR STATISTICAL COMPARISON OF A PLURALITY OF TESTERS

(75) Inventor: Joel L. Dobson, Rowlett, TX (US)

(73) Assignee: Texas Instruments Incorporated, Dallas, TX (US)

( * ) Notice: Subject to any disclaimer, the term of this patent is extended or adjusted under 35 U.S.C. 154(b) by 97 days.

(21) Appl. No.: 10/145,926

(22) Filed: May 15, 2002

(65) Prior Publication Data

US 2003/0125903 A1 Jul. 3, 2003

Related U.S. Application Data

(60) Provisional application No. 60/344,198, filed on Dec. 28, 2001.

(51) Int. Cl.[7] .............................................. G06F 17/18
(52) U.S. Cl. ...................................... 702/181; 714/724
(58) Field of Search ............................ 702/81–84, 117, 702/118, 35, 108, 121, 179, 180–183; 714/724, 734, 26; 324/158.1; 700/121; 703/14; 716/19

(56) References Cited

U.S. PATENT DOCUMENTS

| 5,923,553 A | * | 7/1999 | Yi ............................... 700/110 |
| 6,151,695 A | * | 11/2000 | Kamo et al. ................. 714/734 |
| 6,553,522 B1 | * | 4/2003 | Dalal et al. .................. 714/724 |

* cited by examiner

Primary Examiner—Marc S. Hoff
(74) Attorney, Agent, or Firm—Wade James Brady, III; Frederick J. Telecky, Jr.

(57) ABSTRACT

The invention provides methods and systems for statistically comparing yields among two or more testers in a testing environment where a lot of manufactured articles such as semiconductor wafers are randomly divided among and independently tested by the testers. Generally, in real-time, tests are performed on the lot and yield statistics are determined for each of the two or more testers as a function of test yields and the number of tests performed by each tester. Using the yield statistics, a univariate T-statistic for each tester is determined and serves as the basis for comparing each tester with a predetermined threshold statistical range.

26 Claims, 3 Drawing Sheets

METHOD AND SYSTEM FOR STATISTICAL COMPARISON OF A PLURALITY OF TESTERS

CLAIM TO PRIORITY

This application claims the benefit of U.S. Provisional Application No. 60/344,198, filed Dec. 28, 2001.

TECHNICAL FIELD

The present invention relates in general to real-time statistical analysis of testing of a manufactured product lot split among multiple testers. More particularly, the invention relates to comparing the results of two or more testers for an entire lot of semiconductor wafers using real-time statistical analysis of test data obtained during testing.

BACKGROUND OF THE INVENTION

No manufacturing process, even at concerns such as Texas Instruments, is so perfect that all products are completely alike. There are generally variations that may be caused by a great number of small, uncontrollable factors, and must, therefore, be regarded as a chance variation.

In general, however, it is desirable to ensure that manufactured articles possess characteristics that fall within a required range of values. Such characteristics may define the operating conditions and performance characteristics of the device necessary for compliance verification. For this purpose, it is useful to make tests of the hypothesis that the products possess the required characteristics. If testing is done after an entire lot has been produced, for example, a lot of 24 semi-conductor wafers, each wafer containing hundreds, or even hundreds of thousands of circuits, the testing will reveal how closely the lot of wafers approach the desired characteristics. In this way, products that do not meet rigorous testing standards can be identified and intercepted before they are passed on to customers and production problems can be addressed. This type of testing is common in the art.

One problem with such a testing approach is that considerable time and testing resources may be used in testing a lot that is ultimately rejected. It would be advantageous in terms of cost and efficiency to identify problem products within a lot as early as possible in the testing cycle. A further problem is encountered, however, if the testing process is stopped too liberally. Stopping the testing process even though it is progressing properly is known as a Type I error. Not stopping a process even though something is amiss is known as a Type II error. Thus, either erroneously interrupting or failing to interrupt testing of a lot of manufactured articles can present problems in the art. These and other problems can be traced to potential invalidity of test data and the relative differences in test results obtained for one tester versus another tester.

With reference to the manufacturing of semiconductor wafers, it is well known in the industry to use electronic testers that have fingers that touch bond pads o f a chip. Typically, anywhere from 100 to 1,000 bond pads are touched by the fingers, such that a program is able to access the memory cells of the semiconductor device in order to analyze its performance. Since a lot of semiconductor wafers is split among testers, randomization ensures that wafers from a contaminated lot are split among testers in a fairly even way. Therefore, by the time the lot reaches the tester, any anomalies in the test data can be attributed to failures in a tester or decreased performance by a particular tester.

Thus, since post-process randomization ensures that contaminated lots are split among multiple testers, a ready means of ensuring tester performance and identifying problems is required. One prior method of verifying tester performance is known as ANOVA (analysis of variance). ANOVA is technique that uses analysis of variance to statistically compare the means among groups of test data. In order for ANOVA to be effective, it is usually required to be run for an entire manufacturing cycle in order to collect enough test data for the ANOVA analysis. Moreover, with the ANOVA procedure, a single statistical quantity for each split of a lot is not obtained, making it difficult to isolate any particular tester in terms of its performance versus a required standard or threshold. Therefore, with the ANOVA process, one only obtains the difference between one tester and another, and not an actual figure for each individual tester. This leaves the technician without confidence that any one tester is operating within a certain tolerance or that a particular tester has a problem.

Another disadvantage of prior art tester verification processes is the inability to identify problems in real-time. Typically, an entire testing cycle has to be completed before sufficient data can be obtained for these required statistical analyses. This method, however, is inefficient and costly in a real life manufacturing environment.

Therefore, it would be useful and advantageous to provide a means of minimizing tester errors by identifying problems with one of any of a plurality of testers for which a lot of manufactured devices has been split. Such a means would be useful if it could be applied in real-time and if it could produce some qualitative indicator of the tester's performance.

SUMMARY OF THE INVENTION

In general, the present invention provides novel methods and systems for real-time statistical comparison of a plurality of testers testing a randomly divided lot of manufactured articles such as semiconductor wafers.

According to one exemplary embodiment of the invention, disclosed for use in a semiconductor wafer testing environment is a method of statistically comparing yields among two or more testers. The method comprises the step of randomly dividing a produced lot of wafers among the two or more testers. Next, yield statistics are determined for each of the two or more testers as a function of test yields and the number of tests performed on the lot by each tester. Using the yield statistics, a univariate T-statistic for each tester is determined and is used as the basis for comparing each tester with a predetermined threshold statistical range.

According to one aspect of the invention, the method includes the step of taking corrective action with respect to each tester associated with a univariate T-statistic outside the predetermined threshold statistical range.

According to a further aspect of the invention, method steps are taken in order to provide a Type-I error probability of approximately 0.05.

According to yet another embodiment of the invention, a system is disclosed that has multiple testers for independently performing tests and generating test data relating to articles selected from a manufactured lot. One or more computers coupled to the testers have software for determining yield statistics as a function of real-time test data and a count of the tests performed by each tester. The computer and software include capabilities for determining a univariate T-statistic for each tester, and for comparing the univariate T-statistic of each tester with a predetermined threshold statistical range.

According to still another aspect of the invention, the testers of the system are adapted to test a plurality of test dice disposed on semiconductor wafers.

According to another aspect of the invention, the system includes means for taking corrective action with respect to each tester associated with a univariate T-statistic outside the predetermined threshold statistical range.

According to yet another aspect of the invention, the system includes a distributed computer network coupled to the testers.

Further disclosed is a software-based program product with machine readable instructions executable by a computer. The program product can be used in making real-time statistical comparisons of two or more testers used in testing a randomly divided lot of manufactured articles. Included are instructions for maintaining a count of tests performed by each of the testers, and for monitoring test data generated by each of the testers. The instructions also include capabilities for determining yield statistics for each tester as a function of test count and test data. Also included are instructions for calculating a univariate T-statistic for each tester and for comparing each univariate T-statistic with a predetermined threshold statistical confidence level.

According to yet another aspect of the invention, the machine readable instructions include controlling means for taking corrective action with respect to each tester associated with a univariate T-statistic outside the predetermined threshold statistical range.

According to further additional aspects of the invention, the machine readable instructions may reside on magnetic, optical, or electronic storage media.

The invention provides several technical advantages including, but not limited to, enabling a real-time response to statistical analysis and comparison of the performance of a plurality of testers. Thus, the systems and methods of the invention provide substantial savings of time and expense associated with such testing. A further advantage is provided by aspects of the invention which permit the timely recognition of testing errors so that corrective action may be taken while minimizing the potential for Type I errors, or "false alarms", concerning the validity of the testing.

BRIEF DESCRIPTION OF THE DRAWINGS

The above and additional features and advantages of the present invention will be more clearly understood from consideration of the following detailed description in connection with the accompanying drawings in which.

References in the detailed description correspond to like references in the figures unless otherwise noted. The descriptive and directional terms used in the written description such as top, bottom, left, right, etc., refer to the drawings themselves as laid out on the paper and not to physical limitations of the invention unless specifically noted. The drawings are not to scale and some features of embodiments shown and discussed are simplified or exaggerated for illustrating the principles of the invention.

DETAILED DESCRIPTION OF PREFERRED EMBODIMENTS

Figure 1:
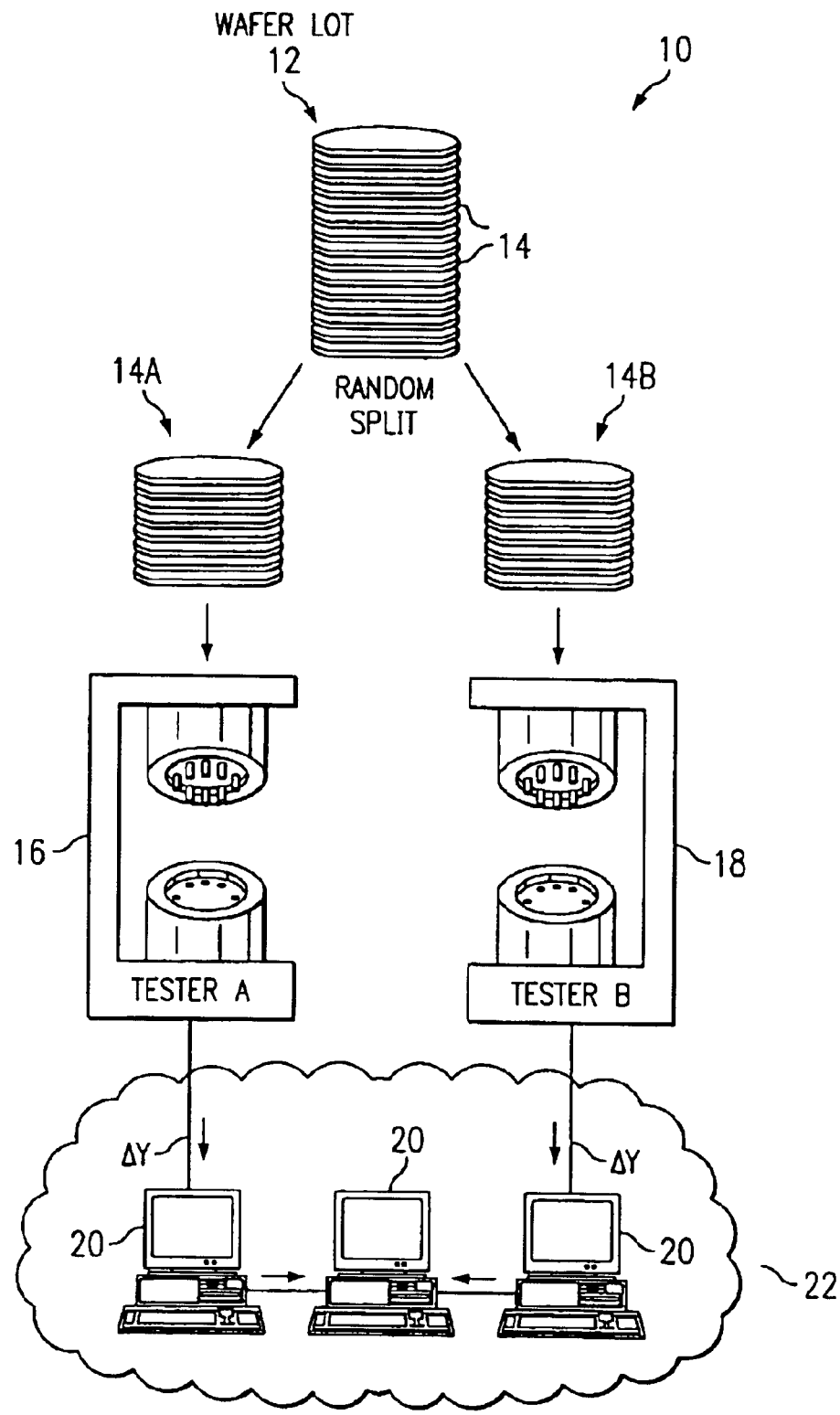
FIG. 1 is an illustration of an example of a preferred embodiment of a system of the invention.

FIG. 1 depicts an example implementation of the invention in the form of a semi-conductor wafer testing system 10. A lot of wafers 12 is made up of individual wafers 14 which are randomly split for testing on two or more testers, such as tester 16 and tester 18. Each tester 16, 18 is coupled to one or more computer(s) 20. Of course it will be apparent to those skilled in the art that the number of testers, type, number and configuration of computers and other details of the testing environment may be varied without altering the concept of the invention. In the presently preferred embodiment, the computers 20 are networked providing data and software sharing capabilities.

In general, each time a wafer 14 is tested, for example wafer 14A, a check is made to determine whether at least two wafers 14 from this particular lot 12 have been tested on this particular tester, in this example tester 16, and that at least two wafers from this lot 12 have been tested on some other tester, in this case, tester 18. Assuming for the sake of this example that this is so and that tester 16 has tested at least two wafers and tester 18 has tested at least two wafers. Yields statistics 17 relating to testers 16 and 18, and the wafers tested thereon, are compiled. The average yield per wafer for each tester is readily determined by adding the individual wafer yields and dividing by the number of wafers tested. The average yield per lot is also determined by averaging the wafer yields for all wafers in the lot.

Figure 2:
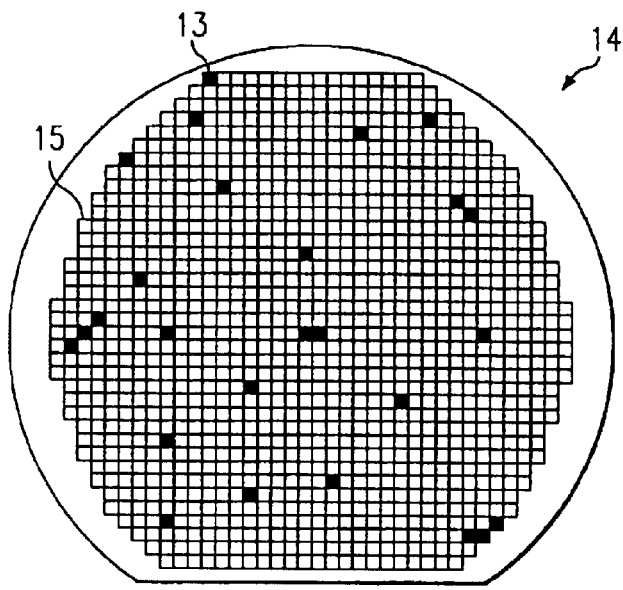
FIG. 2 is a graphical representation of defects on a wafer.

FIG. 2 is a graphical representation of defective dice 13 on a wafer 14. Defective dice 13 are shown by the shaded areas and may be located at focal points or randomly on the wafer 14. Non-defective dice 15 are indicated by the unshaded portions.

Preferably, the corrected yield per wafer, also denominated herein as delta yield, $\Delta Y$, is computed by subtracting the yield per lot from the yield per wafer. This relationship is governed by Equation (1) below:

$$\Delta Y = Y_{wafer} - Y_{lot} \qquad \text{Equation (1)}$$

Figure 3:
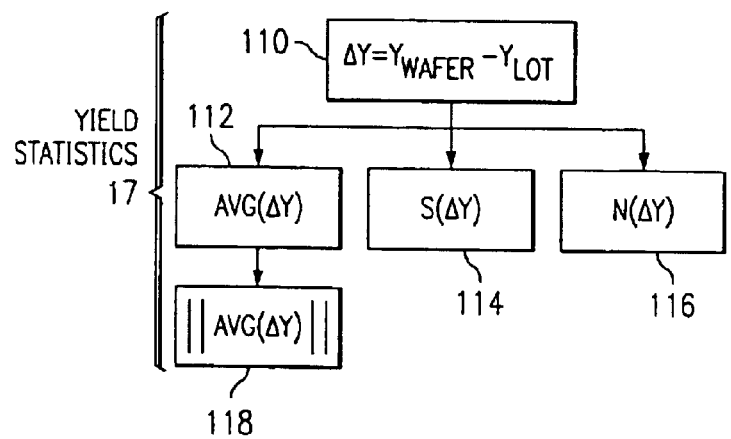
FIG. 3 is a process flow diagram of a method of computing yield statistics for use according to the invention.

Thus, as shown in FIG. 3 and further described below, one delta yield value is preferably computed 110 for each wafer tested. The average 112, standard deviation 114, and count 116 of wafers tested can then be computed. Typically the tester having the largest average delta yield and the tester having the smallest average delta yield are then identified 118.

Using the yield statistics 17, a univariate T statistic may be calculated for each tester according to Equation (2):

$$T(\Delta Y) = \frac{\text{average } (\Delta Y) \times \text{sqrt}\{N(\Delta Y) - 1\}}{s(\Delta Y)} \qquad \text{Equation (2)}$$

Figure 4:
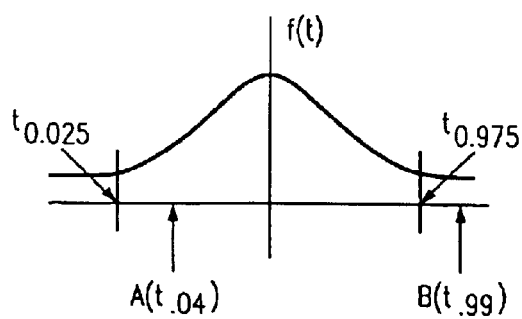
FIG. 4 is a graphical representation of a probability density function known in the art.

Typically, this produces a T-distribution with $N(\Delta Y)-1$ degrees of freedom. Thus, a probability associated with this T-score can be obtained by integrating from negative infinity up to $T(\Delta Y)$ using the probability density function $f(T)$ of a T-distribution with $N(\Delta Y)-1$ degrees of freedom. This probability is a cumulative probability associated with the T-score for each tester. Using this data, the systems and methods of the invention individually evaluate the results obtained from each tester, making possible a comparison between the tester results and the probability of obtaining such results. A graphical representation of a typical probability density function is shown in FIG. 4.

An example of the invention is now described in general, followed by an additional description with reference to FIG.

5. In the preferred embodiment of the invention, if the probability of given T-score of given tester results is less than about 0.025, the tester associated with the low probability T-score may be producing an abnormally low yield. Accordingly, each tester having an associated T-score giving a probability of less than 0.025 is preferably subjected to corrective action. In this example, the probability of 0.025 is used in order to help minimize Type I errors. Of course, it will be understood by those familiar with the art that a different threshold value may be used according to the Type I error tolerance and other considerations relating to the particular testing procedure. In this instance the corrective action taken is to immediately take the tester offline and attempt to identify the source of the apparent abnormally low yield.

On the other hand, a probability associated with a particular tester T-statistic of greater than 0.975 would indicate that the associated tester is most likely producing an abnormally high yield. In the present example of the invention, this would necessitate corrective action in the form of taking offline every tester currently testing wafers from the same lot from which the apparently abnormally high yielding tester is also testing wafers. Preferably, however, the probing of a particular wafer is not interrupted, but rather, each of the testers engaged in probing a wafer from the effected lot is permitted to complete testing its current wafer before being taken offline for further corrective action. Of course, in other testing applications or testing environments the probability value for taking corrective action because of an apparent abnormally good yield could be higher or lower.

In this example, a probability between 0.025 and 0.975 indicates that the tester associated with such a probability value is performing its function adequately and it is then allowed to continue on and test the next wafer. It should be understood that each of the testers must have an associated probability within the predetermined acceptable range, in this particular case between 0.025 and 0.975, in order to be used for continued testing. Of course, it will also be apparent to those skilled in the arts that the above described systems and methods may be advantageously implemented by means of computer software accessible to computers coupled to the testers, either individually or through a network.

Figure 5:
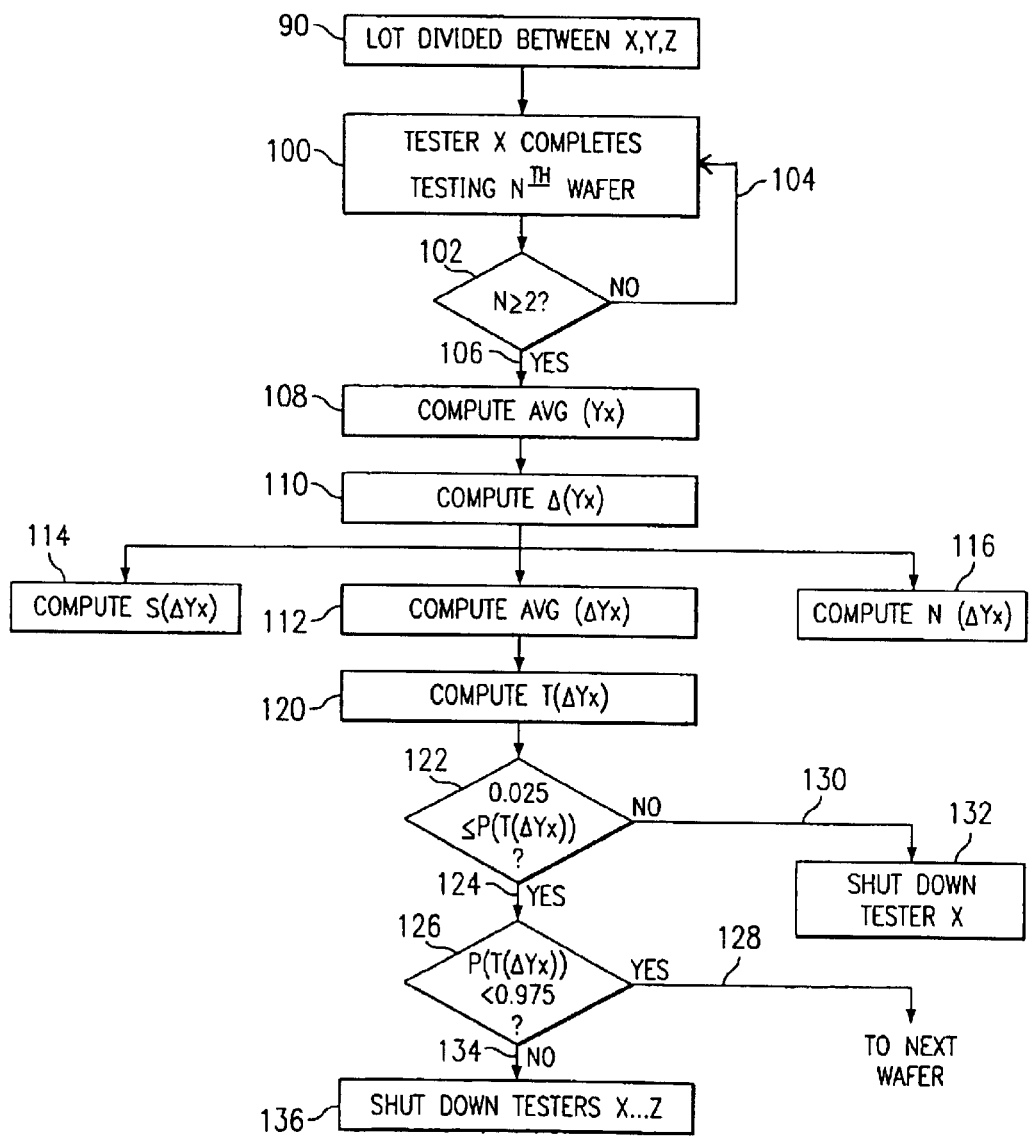
FIG. 5 is a process flow diagram illustrating the steps in an example of a preferred embodiment of the invention.

FIG. 5 is a process flow diagram illustrating a method of the invention. As shown in step 100, a tester, herein designated tester "X" to indicate that the step applies to each and every tester involved in the testing of the current lot, completes testing of an $N^{th}$ wafer. As shown by decision diamond 102, if "N" is not greater than or equal to 2, arrow path 104 is followed and tester "X" tests another wafer. Otherwise, process flow is directed to step 108. If tester "X" has completed testing the second or a subsequent wafer, the average yield of tester "X" is computed and shown in step 108.

Continuing to step 110, a delta yield is then computed for tester "X". Subsequently, as shown by steps 112, 114 and 116, the average delta yield for tester "X," standard deviation of the delta yield of tester "X" and number of tests performed by tester "X" may then be computed.

A T-score for the average delta yield of tester "X" is then determined as shown in step 120 and, as indicated by decision diamond 122, is checked against the lower confidence limit of the particular T-score, in this case 0.025 as indicated by arrow path 124. The T-score is also checked against the upper confidence limit in decision diamond 126, as shown by arrow path 124. If the probability of the T-score computed for tester "X" is within acceptable confidence limits, the method proceeds back to step 100 and tests the next wafer. In the event that the T-score probability of tester "X" proves to be below the lower confidence limit or above the upper confidence limit, corrective action is taken so that the associated tester, in this case tester "X," is shut down, step 132 or step 136.

Returning to decision diamond 126, in the event that the probability of the T-score of tester "X" is above the range of acceptable probability values, in this case 0.975, arrow path 134 is followed and all testers associated with the lot being tested by tester "X" and its companion testers, in this case testers "Y" and "Z", are shut down, step 136. As described above, step 136 may also include further steps for allowing testers "Y" and "Z" to complete testing of their current wafers upon which testing is in progress.

Thus, the systems and methods shown and described, and the possible alternative embodiments, may be used to evaluate the test data produced by two or more testers performing tests on a randomly divided lot. Assuming the initial condition of N=2 is met, the systems and methods of the invention may be reiterated, in principle indefinitely, in order to compare individual tester data with statistical predictions.

With reference to the following tables, a numerical example is provided to further illustrate the method of the invention. In the following numerical example, 12 wafers are randomly distributed between two testers for yield testing. Tester A tests 7 wafers and Tester B tests 7 wafers, thus, N=7. This example is simplified for convenience in explaining and understanding the invention. In practice of course, larger lots, a larger number of testers, and an unequal number of wafers tested by each tester may be used.

Suppose we start with 14 wafers run in a row:

| tester | time when wafer completes | yield | number |
|--------|---------------------------|-------|--------|
| a | 11:02 | 61.7 | 1 |
| b | 11:04 | 65.1 | 2 |
| a | 11:06 | 59.8 | 3 |
| b | 11:08 | 64.4 | 4 |
| a | 11:10 | 60.1 | 5 |
| b | 11:12 | 63.7 | 6 |
| a | 11:14 | 62.1 | 7 |
| b | 11:16 | 68.8 | 8 |
| a | 11:18 | 61.8 | 9 |
| b | 11:20 | 68 | 10 |
| a | 11:22 | 63.7 | 11 |
| b | 11:24 | 67.1 | 12 |
| a | 11:26 | 61.5 | 13 |
| b | 11:28 | 65.2 | 14 |

After the first 4 wafers have finished, we observe the following statistics:

For split A:

| | |
|---|---|
| average delta yield | −2 |
| number of wafers | 2 |
| standard deviation | 1.343503 |
| t | −1.48865 |
| probability | 0.188285 |

For split B:

| | |
|---|---|
| average delta yield | 2 |
| number of wafers | 2 |
| standard deviation | 0.494975 |
| t | 4.04061 |
| probability | 0.922774 |

Since 0.188 is larger than 0.025 AND 0.922774 is smaller than 0.975, we do not stop the testers.

In likewise manner, after testing 5 wafers, we also do not stop the testers, as the statistics are:

| split A | | Split B | |
|---|---|---|---|
| average delta yield | −1.68667 | average delta yield | 2.53 |
| number of wafers | 3 | number of wafers | 2 |
| standard deviation | 1.021437 | standard deviation | 0.494975 |
| t | −2.33525 | t | 5.111372 |
| probability | 0.072313 | probability | 0.938502 |

In this example, it is only after we have completed 8 wafers that we finally decide to stop the testers. The statistics are:

| split A | | split B | |
|---|---|---|---|
| average delta yield | −2.2875 | average delta yield | 2.2875 |
| number of wafers | 4 | number of wafers | 4 |
| standard deviation | 1.144188 | standard deviation | 2.27303 |
| t | −3.46277 | t | 1.743077 |
| probability | 0.020279 | probability | 0.910162 |

The idea is that we finally have 0.02 which is less than 0.025. If we had run all 14 wafers from this example, then we would observe the following statistics:

| split A | | split B | |
|---|---|---|---|
| average delta yield | −2.25714 | average delta yield | 2.257143 |
| number of wafers | 7 | number of wafers | 7 |
| standard deviation | 1.302196 | standard deviation | 1.929471 |
| t | −4.24579 | t | 2.865474 |
| probability | 0.002703 | probability | 0.985702 |

As can be seen from the tables above, seven yield results have been obtained for each of testers A and B. The Yield per Lot is based on all results from all tests performed on the lot thus far, i.e.; N=7. It should be appreciated that each tester may be evaluated at any time as long as N is equal to or greater than 2. Preferably the prior performance of each tester is evaluated as the tester engages in testing its next wafer.

Beginning with tester A, the yield statistics are compiled as reflected in the table. Delta yield (Δ Yield A) values are obtained by subtracting the average yield per lot from the yield per wafer. The mean, standard deviation and variance are then calculated as known in the arts. The univariate T-statistic, or T-score, for Tester A is then computed, as illustrated by Equation 2 above.

It is assumed that the data is Normally distributed. The probability density function of the T distribution may be obtained by means of a look-up table or integration. The cumulative probability value thus obtained is then compared with the preselected range of acceptable probability values. If the yields obtained by Tester A are found to be improbably high or low, the appropriate corrective action is taken. In this example, referring to the probability density function depicted in FIG. 4, the T-score associated with tester A has a probability of about 0.04, which is within the assumed acceptable range of greater than 0.025 and less than 0.975. Accordingly, no corrective action is taken with respect to tester A, and tester A continues testing the next wafer (N=7, not shown). At the completion of, and during the testing of the wafer, the method may be repeated. Of course, the process may be repeated indefinitely.

The probability density function of the T distribution is consulted by means of a look-up table or integration. The cumulative probability value thus obtained is compared with the preselected range of acceptable probability values. If the yield obtained by Tester B is improbably high or low, the appropriate corrective action can be taken. In this example, after eight wafers have been tested, the T-score associated with Tester B, for 3 degrees of freedom (N−1), has a probability of 0.02, which, referring to the probability density function of FIG. 4, is outside of the acceptable range of 0.025 and 0.975. Accordingly, corrective action is taken with respect to Tester B. For example, assuming testing of a fifth wafer (N=5) is in progress, preferably Tester B will be taken offline and investigated for its apparently abnormally high yield when testing of wafer 5 is completed. Tester A will be taken offline as well to prevent Type II errors in the event the Tester B results are in fact correct.

Thus, by applying statistical analysis and making a statistical comparison of the performance of two or more testers independently performing tests on water randomly split for a lot among the testers, the invention provides real-time comparison of the performance of an individual tester. Thereby, the invention also provides timely and real-time recognition of testing errors so that corrective action may be taken. Moreover, contrary to the prior art, the present invention provides a measure of performance for a particular tester as opposed to relative statistics for a group of testers.

While the invention has been described with reference to illustrative embodiments, this description is not intended to be construed in a limiting sense. Various modifications and combinations of the illustrative embodiments as well as other embodiments of the invention will be apparent to persons skilled in the art upon reference to the description and claims.

What is claimed is:

1. Machine readable instructions executable by a computer for use in making real-time statistical comparisons of two or more testers testing a randomly divided lot of manufactured articles, comprising:
   means for maintaining a count of tests performed by each of the two or more testers;
   means for monitoring test data generated by each of the two or more testers;
   means for determining yield statistics as a function of test count and test data for each tester;
   means for calculating a univariate T-statistic for each tester; and
   means for comparing each univariate T-statistic with a predetermined threshold statistical range.

2. Machine readable instructions according to claim 1 wherein the test data relates to a plurality of test dice on a semiconductor wafer.

3. The machine readable instructions of claim 2 wherein the controlling means further comprise instructions for taking offline each tester testing a lot for which a univariate T-statistic associated with one or more tester is above the predetermined threshold statistical range.

4. The machine readable instructions of claim 3 further comprising instructions for permitting each tester to complete a test in progress prior to taking the tester offline.

5. The machine readable instructions of claim 2 wherein the controlling means further comprise instructions for taking offline each tester associated with a univariate T-statistic below the predetermined threshold statistical range.

6. The machine readable instructions of claim 1 further comprising controlling means for taking corrective action with respect to each tester associated with a univariate T-statistic outside the predetermined threshold statistical range.

7. The machine readable instructions of claim 1 further comprising a magnetic storage medium.

8. The machine readable instructions of claim 1 further comprising an optical storage medium.

9. The machine readable instructions of claim 1 further comprising an electronic storage medium.

10. The machine readable instructions of claim 1 wherein the means for determining yield statistics for each tester further comprises instructions for:

computing an average corrected yield, avg($\Delta y$), associated with each tester by the relationship, avg($\Delta y$)=$y_{test}$-$y_{lot}$;

wherein $y_{test}$ is the yield per tested article and $y_{lot}$ is the yield per lot.

11. The machine readable instructions of claim 1 wherein the means for determining a univariate T-statistic for each tester further comprises instructions for:

computing a univariate T-statistic for the average corrected yield of each tester; and computing T($\Delta y$)=avg($\Delta y$)*sqrt $\{n(\Delta y)-1\}$/s($\Delta y$);

wherein s($\Delta y$) is the standard deviation associated with the avg($\Delta y$) and n is the count of tests performed by an associated tester.

12. The machine readable instructions according to claim 1 wherein the threshold range of univariate T-statistics consists of probability within the range of about 0.025 to about 0.975.

13. The machine readable instructions according to claim 1 wherein the threshold statistical range is selected in order to provide a Type-I error probability of approximately 0.05.

14. In a wafer testing environment, a method of statistically comparing yields among two or more testers comprising the steps of:

for a plurality of wafers comprising a lot, randomly dividing the lot among the two or more testers;

for each of the two or more testers, determining yield statistics as a function of real-time wafer test yields and the number of wafer tests performed on the lot by each tester; and using the yield statistics, determining a univariate T-statistic for each tester for comparing the univariate T-statistic for each tester with a predetermined threshold statistical range.

15. The method of claim 14 further comprising the step of taking corrective action with respect to each tester associated with a univariate T-statistic outside the predetermined threshold statistical range.

16. The method of claim 15 wherein the step of taking corrective action further comprises the step of:

for a lot in which a univariate T-statistic associated with one or more tester is above the predetermined threshold statistical range, taking offline each tester testing the lot.

17. The method of claim 16 further comprising the step of permitting each tester to complete a test in progress prior to taking the tester offline.

18. The method of claim 15 wherein the step of taking corrective action further comprises the step of taking offline each tester associated with a univariate T-statistic below the predetermined threshold statistical range.

19. The method of claim 14 wherein the step of determining yield statistics for each tester further comprises the steps of:

computing an average corrected yield, avg($\Delta y$), associated with each tester by the relationship, avg($\Delta y$)=$y_{wafer}$-$y_{lot}$;

wherein $y_{wafer}$ is the yield per wafer and $y_{lot}$ is the yield per lot.

20. The method of claim 9 wherein the step of determining a univariate T-statistic for each tester further comprises the steps of:

computing a univariate T-statistic for the average corrected yield of each tester; and computing T($\Delta y$)=(avg($\Delta y$)*sqrt $\{n(\Delta y)-1\}$)/s($\Delta y$);

wherein s($\Delta y$) is the standard deviation associated with the avg($\Delta y$) and n is the number of tests performed by an associated tester.

21. The method according to claim 14 wherein the threshold range of univariate T-statistic values consists of probability within the range of about 0.025 to about 0.975.

22. The method according to claim 14 wherein the threshold statistical range is selected in order to provide a Type-I error probability of approximately 0.05.

23. A system for statistically comparing two or more testers testing a randomly divided lot of manufactured articles, comprising:

a plurality of testers for independently performing tests on articles selected from a manufactured lot and generating test data;

one or more computer coupled to the plurality of testers;

software executable by the one or more computer, the software further comprising;

means for determining yield statistics as a function of real-time test data and a count of the tests performed on the lot by each tester;

means for determining a univariate T-statistic for each tester; and means for comparing the univariate T-statistic of each tester with a predetermined threshold statistical range.

24. The system of claim 23 wherein the testers are adapted to test a plurality of test dice on semiconductor wafers.

25. The system of claim 23 further comprising controlling means for taking corrective action with respect to each tester associated with a univariate T-statistic outside the predetermined threshold statistical range.

26. The system of claim 23 wherein the one or more computers comprise a distributed network coupled to the plurality of testers.

* * * * *

UNITED STATES PATENT AND TRADEMARK OFFICE
Certificate

Patent No. 6,792,386 B2                                    Patented: September 14, 2004

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Joel L. Dobson, Rowlett, TX (US); Eugene Wang, Shanghai (CH); and Carl Z. Zhou, Plano, TX (US).

Signed and Sealed this Fourth Day of September 2007.

JOHN E. BARLOW
*Supervisory Patent Examiner*
Art Unit 2863